United States Patent
Deumal Herraiz et al.

(10) Patent No.: US 9,772,392 B2
(45) Date of Patent: Sep. 26, 2017

(54) APPARATUS AND METHOD FOR DIAGNOSING HARDWARE IN AN INSULATION RESISTANCE MONITORING SYSTEM FOR A VEHICLE

(71) Applicant: Lear Corporation, Southfield, MI (US)

(72) Inventors: Marc Deumal Herraiz, Valls (ES); Ricardo Riazor Gil, Valls (ES); Eladi Homedes Pedret, Valls (ES)

(73) Assignee: Lear Corporation, Southfield, MI (US)

( * ) Notice: Subject to any disclaimer, the term of this patent is extended or adjusted under 35 U.S.C. 154(b) by 233 days.

(21) Appl. No.: 14/632,342

(22) Filed: Feb. 26, 2015

(65) Prior Publication Data

US 2016/0252555 A1  Sep. 1, 2016

(51) Int. Cl.
  *G01R 27/08* (2006.01)
  *G01R 35/00* (2006.01)
  *G01R 27/02* (2006.01)
  *G01R 31/00* (2006.01)

(52) U.S. Cl.
  CPC ............ *G01R 35/00* (2013.01); *G01R 27/025* (2013.01); *G01R 31/007* (2013.01)

(58) Field of Classification Search
  CPC .... G01R 31/005; G01R 31/12; G01R 31/025; G01R 31/14; G01R 31/006; G01R 31/11; G01R 27/18; G01R 31/02; G01R 31/36; B60L 3/0046; B60L 3/0069; B60L 3/0076; B60L 3/12
  See application file for complete search history.

(56) References Cited

U.S. PATENT DOCUMENTS

| | | | |
|---|---|---|---|
| 6,919,726 B2 | 7/2005 | Yudahira | |
| 7,554,333 B2 | 6/2009 | Morita | |
| 8,040,139 B2 | 10/2011 | Plagens et al. | |
| 8,168,315 B1 | 5/2012 | Hermann | |
| 2007/0285057 A1* | 12/2007 | Yano | B60L 3/0046 320/116 |
| 2009/0179655 A1 | 7/2009 | Trenchs Magana et al. | |
| 2009/0278547 A1 | 11/2009 | Acena et al. | |
| 2009/0323233 A1 | 12/2009 | Shoemaker et al. | |
| 2010/0259276 A1* | 10/2010 | Streit | G01R 31/362 324/525 |

(Continued)

FOREIGN PATENT DOCUMENTS

JP  2004104923 A  4/2004

*Primary Examiner* — Minh N Tang
(74) *Attorney, Agent, or Firm* — Brooks Kushman P.C.

(57) ABSTRACT

In at least one embodiment an apparatus for diagnosing electronics in an insulation resistance monitoring system is provided. The apparatus includes a controller for being electrically coupled to a plurality of electronics including a plurality of switches that are electrically coupled to a positive branch and to a negative branch in a high voltage network and a low voltage network. The plurality of electronics is configured to perform insulation resistance monitoring in a vehicle. The controller is further configured to at least one of activate and deactivate any number of the plurality of switches to determine an overall voltage of the positive branch and the negative branch. The controller is further configured to detect a fault in at least one of the positive branch and the negative branch that corresponds to a failure of any one of the plurality of electronics based on the overall voltage.

17 Claims, 7 Drawing Sheets

(56) References Cited

U.S. PATENT DOCUMENTS

| | | |
|---|---|---|
| 2011/0307196 A1 | 12/2011 | Schumacher |
| 2013/0106437 A1 | 5/2013 | Herraiz et al. |
| 2013/0278272 A1 | 10/2013 | Kaminski et al. |
| 2015/0285851 A1* | 10/2015 | Kawamura ............ G01R 31/14 324/509 |
| 2015/0346257 A1* | 12/2015 | Tabatowski-Bush G01R 31/006 324/503 |

* cited by examiner

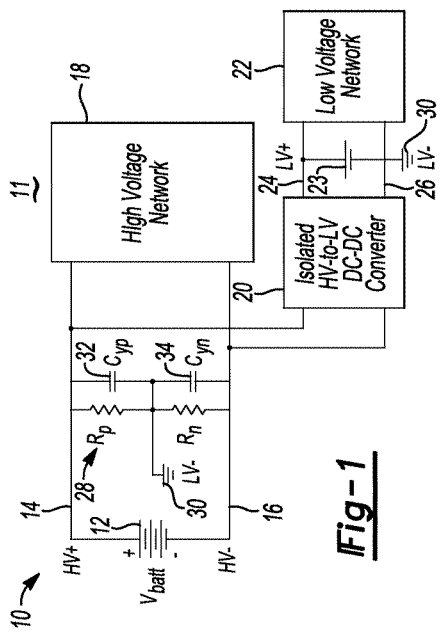
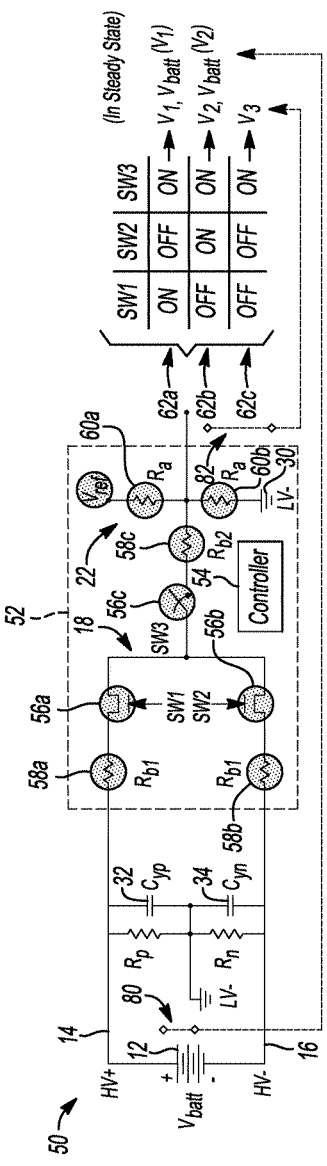

| | $R_p$ | $R_n$ | HW Error | Real $R_{ISM}$ | Measure $R_{ISM}$ | Permanent Effect |
|---|---|---|---|---|---|---|
| 95k | 100kΩ | 2MΩ | Fail-to-Close Error in Negative optoMOS | 95kΩ | 19.4MΩ | Undetected Insulation Fault to HV+ |
| 95k | 100kΩ | 2MΩ | Open Circuit Error in Negative $R_{b1}$ | 95kΩ | 19.4MΩ | Undetected Insulation Fault to HV+ |
| 95k | 2MΩ | 100kΩ | Fail-to-Close Error in Positive optoMOS | 95kΩ | 11.8MΩ | Undetected Insulation Fault to HV- |
| 95k | 2MΩ | 100kΩ | Open Circuit Error in Positive $R_{b1}$ | 95kΩ | 11.8MΩ | Undetected Insulation Fault to HV- |
| 50k | 100kΩ | 100kΩ | Fail-to-Close Error in Both optoMOS | 50kΩ | >20MΩ | Undetected Insulation Fault to HV+ and HV- |
| 50k | 100kΩ | 100kΩ | Fail-to-Close Error in Reed Relay | 50kΩ | >20MΩ | Undetected Insulation Fault to HV+ and HV- |
| 50k | 100kΩ | 100kΩ | Open Circuit Error in $R_{b2}$ | 50kΩ | >20MΩ | Undetected Insulation Fault to HV+ and HV- |
| 50k | 100kΩ | 100kΩ | Fail-to-Close Error in Negative optoMOS | 50kΩ | >20MΩ | Undetected Insulation Fault to HV+ and HV- |

Fig-3

APPARATUS AND METHOD FOR DIAGNOSING HARDWARE IN AN INSULATION RESISTANCE MONITORING SYSTEM FOR A VEHICLE

TECHNICAL FIELD

Aspects disclosed herein generally relate to an apparatus and method for diagnosing hardware in an insulation resistance monitoring system for a vehicle.

BACKGROUND

U.S. Publication No. 2013/0106437 to Herraiz et al. provides a monitor for monitoring isolation resistance, impedance, or other isolation reflective conditions between vehicle systems. The monitor may be useful in assessing insulation resistance between a high-voltage power net and a low-voltage power net. The monitor may be configured to assess a sufficiency of the insulation resistance based on a frequency response of the high-voltage power net.

U.S. Publication No. 2011/0307196 to Schumacher provides a system and method for ground isolation detection in a vehicle. A first amplifier is arranged to receive a first signal from a first bus terminal. A second amplifier is configured to receive a second signal from a second bus terminal. An inverter input of an inverter is coupled to the output of the first amplifier. An input or inputs of an analog-to-digital converter are coupled to an inverter output of the inverter and the output of the second amplifier. The analog-to-digital converter is capable of producing a digital signal representative of the signals received from the first bus terminal and the second bus terminal. A data processor is capable of receiving an output of the analog-to-digital converter. The data processor is configured to apply one or more frequency domain transforms to the digital signal. The data processor identifies a circuit location of the ground fault or degraded isolation, a type of ground fault, or both based on the application of the frequency domain transform.

SUMMARY

In at least one embodiment an apparatus for diagnosing electronics in an insulation resistance monitoring system is provided. The apparatus includes a controller for being electrically coupled to a plurality of electronics including a plurality of switches that are electrically coupled to a positive branch and to a negative branch in a high voltage network and a low voltage network. The plurality of electronics is configured to perform insulation resistance monitoring in a vehicle. The controller is further configured to at least one of activate and deactivate any number of the plurality of switches to determine an overall voltage of the positive branch and the negative branch. The controller is further configured to detect a fault in at least one of the positive branch and the negative branch that corresponds to a failure of any one of the plurality of electronics based on the overall voltage.

In at least another embodiment, an apparatus for diagnosing electronics in an insulation resistance monitoring system is provided. The apparatus includes a controller for being electrically coupled to a plurality of electronics including a plurality of switches that are electrically coupled to a positive branch and a negative branch in a high voltage network and a low voltage network. The plurality of electronics is configured to perform insulation resistance monitoring in a vehicle. The controller is configured to at least one of activate and deactivate any number of the plurality of switches to determine a mean voltage of the positive branch and the negative branch. The controller is further configured to detect a fault in at least one of the positive branch and the negative branch that corresponds to a failure of any one of the plurality of electronics based on the mean.

In at least another embodiment, an apparatus for diagnosing electronics in an insulation resistance monitoring system is provided. The apparatus includes a controller for being electrically coupled to a plurality of electronics including a plurality of switches that are electrically coupled to a positive branch and a negative branch in a high voltage network and a low voltage network. The plurality of electronics is configured to perform insulation resistance monitoring in a vehicle. The controller is further configured to at least one of activate and deactivate any number of the plurality of switches to determine an overall voltage and a mean voltage of the positive branch and the negative branch. The controller is further configured to detect a fault in at least one of the positive branch and the negative branch that corresponds to a failure of any one of the plurality of electronics based on the overall voltage.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

FIG. 1 depicts a circuit that illustrates a model of an insulation resistance in a vehicle;

FIG. 2 depicts an example of an apparatus that performs insulation resistance monitoring;

FIG. 3 depicts a table corresponding to actual measurements of the insulation resistance and calculated values for the insulation resistance;

DETAILED DESCRIPTION

Figure 4:
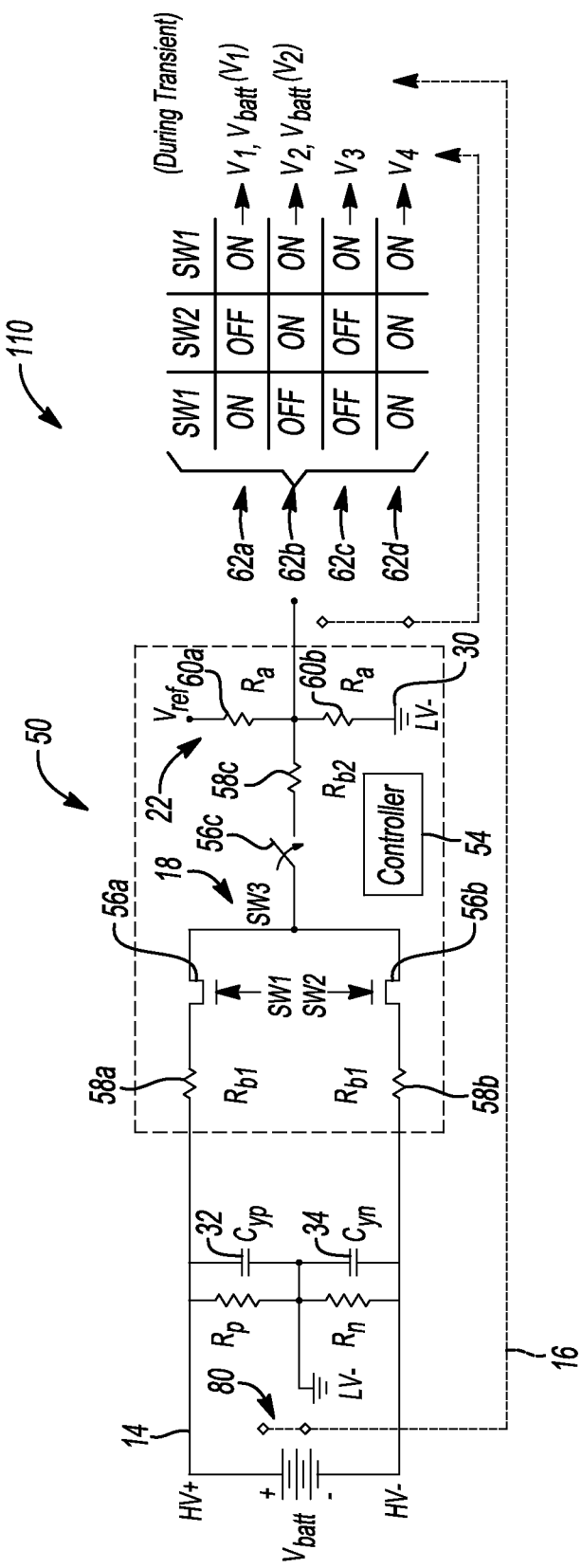
FIG. 4 depicts an apparatus for diagnosing hardware in an insulation resistance monitoring system in accordance to one embodiment.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Embodiments of the present disclosure generally provide for a plurality of circuits or other electrical devices. All references to the circuits and other electrical devices and the functionality provided by each, are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof, and software which co-act with one another to perform operation(s) disclosed herein.

Electric vehicles (EV), hybrid-electric vehicles (HEVs), and other vehicles may include a high-voltage power net and a low-voltage power net. The low-voltage power net may be grounded to a vehicle chassis whereas the high-voltage power net may include a floating ground, for example, a ground that is not provided to the vehicle chassis. Because the high-voltage power net is not grounded to the same ground as the vehicle chassis, a potential may exist for an electrical discharge between the high-voltage power net and the low-voltage power net. In some cases where the high-voltage power net is relatively large, it may be desirable to provide a certain amount of insulation between the high-voltage power net and the low-voltage power net, which in essence may be provided as insulation resistance.

The desired amount of insulation resistance may vary based on a magnitude of the voltage being carried over the high-voltage power net and/or a voltage differential that is present between the high-voltage power net and the low-voltage power net. The amount of insulation resistance may be based on an amount of impedance that is present between the high-voltage power net and vehicle ground (e.g., the vehicle chassis). The impedance between the high-voltage power net and the vehicle ground may be assessed prior to activation/start-up of the high-voltage power net, (e.g., prior to a high-voltage battery or other high-voltage energy source discharging). This pre-activation impedance determination may be beneficial in assessing the insulation resistance prior to operation of the high-voltage power net. However, such a determination may fail to sufficiently assess insulation concerns that may arise after activation of the high-voltage power net.

FIG. 1 depicts a circuit 10 that illustrates a model of an insulation resistance in a vehicle 11. The circuit 10 includes a high voltage (HV) power supply 12 (e.g., $V_{batt}$), a HV positive branch 14 (e.g., HV+) and a HV negative branch 16 (e.g., HV−). A positive terminal of the high voltage power supply 12 is connected to the HV positive branch 14. A negative terminal of the HV power supply 12 is connected to the HV negative branch 16. A HV network (or HV power net) 18 (e.g., battery charging system) is arranged to receive high voltage (e.g., over 200V) from the HV power supply 12 via the HV positive branch 14 and the HV negative branch 16. A high voltage to low voltage DC to DC converter 20 converts the high voltage from the high voltage power supply 12 into a low voltage (e.g., 12-16V) that is suitable for consumption by a low voltage (LV) network (or LV power net) 22 and storage on at least one LV battery 23. Devices on the LV power net 22 may comprise heating cooling devices, power windows, entertainment systems, vehicle lighting, vehicle locking/unlocking device, etc. The DC to DC converter 20 provides the low voltage to the LV power net 22 via a LV positive branch (LV+) 24 and a LV negative branch (LV−) 26.

A controller (not shown) is generally configured to monitor an insulation resistance 28 (e.g., Rp and Rn) in the vehicle 11. A decoupling capacitor 32 (e.g., Cp) is placed in parallel with the internal resistance Rp. Additionally, a decoupling capacitor 34 (e.g., Cn) is placed in parallel with the internal resistance Rn. It is to be noted that the insulation resistance 28 does not comprise actual resistors that are implemented within the vehicle 11 for the purpose providing the high voltage and the low voltage to the HV power net 18 and the LV power net 22, respectively. Rather, the insulation resistance 28 represents a model of the resistance formed between the HV power net 18 and the LV power net 22. Such an insulation resistance 28 should sustain an adequate level of resistance to prevent excessive current flow from the HV power net 18 to the LV power net 22. For example, the HV power net 18 is generally grounded at the negative terminal of the HV power supply 12 while the LV power net 22 is generally grounded at a vehicle chassis ground 30. In the event the HV power net 18 and/or the LV power net 22 is not properly grounded, an insulation fault may occur thereby creating a low-resistance path between the HV power net 18 and the LV power net 22 within the vehicle 11.

FIG. 2 depicts an example of a system 50 that performs insulation resistance monitoring. The system 50 (or insulation resistance monitoring (IRM) system 50) includes an IRM circuit 52 for measuring the insulation resistance 28 between the HV power net 18 and the LV power net 22 for the reasons noted above. The IRM system 50 includes a controller 54 and a plurality of switches 56a, 56b, and 56c (or "56"). In one example, the switches 56 may be implemented as opto metal-oxide-semiconductor field-effect transistors (MOSFETs). The controller 54 and the switches 56 are positioned on the HV power net 18. Resistors 58a, 58b, and 58c (or "58") are electrically coupled to the switches 56a, 56b, and 56c, respectively. On the LV power net 22, resistors 60a and 60b ("60") are also provided for purposes of performing the insulation resistance measurement.

In general, the controller 54 controls the switches 56a, 56b, and 56c to open and close in accordance to a plurality of switching arrangements 62a, 62b, and 62c to perform the insulation resistance measurements. For example, in response to executing each switching arrangement 62, the controller 54 measures a voltage across $V_{batt}$ (e.g., $V_{batt}^{Vn}$) (where n is equal to 1, 2, and 3 which correspond to the number of switch arrangements) as generally shown at 80 and a voltage $V_n$ at a point 82 in the LV power net 22.

Once the controller 54 calculates each value for $V_n$ and $V_{batt}^{(Vn)}$, the controller 54 determines the insulation resistance (or $R_{ISM}$) in accordance to the equation 1 (or Eq. 1) as shown below:

$$R_{ISM} = R_p // R_n = R_a \cdot \frac{V_{batt}^{(V_1)} \cdot V_{batt}^{(V_2)} + V_3 \left( V_{batt}^{(V_1)} - V_{batt}^{(V_2)} \right)}{(V_1 - V_3) \cdot V_{batt}^{(V_2)} + (V_3 - V_2) \cdot V_{batt}^{(V_1)}} - (R_a + R_{b1} + R_{b2})$$

In general, the controller 54 is configured to measure the insulation resistance, for example, every 25 seconds during vehicle operation. It is recognized however that the foregoing implementation for determining the insulation resistance may not be able to detect various insulation faults. For example, various electronics or hardware (e.g., switches 56 and resistors 58, 60) utilized in the system 50 can result in the controller 54 providing measurement values of the insulation resistance that appear to be adequate but are not necessarily the case. Specifically, in the event the controller 54 determines that the insulation resistance ($R_{ism}$) is a value between 10M Ohms and 50M Ohms, this condition indicates that the insulation resistance is acceptable to prevent an insulation fault between the HV power net 18 and the LV power net 22. The switches 56 and the resistors 58 (and 60) are components that may age or degrade over time. Thus, this condition may lead the controller 54 to calculate the insulation resistance and determine that various values for the insulation resistance are deemed acceptable when, in actuality, due to aging, the insulation resistance may be too low. Therefore, false readings of the insulation resistance may be provided. In general, an insulation fault is generally detected if the insulation resistance is less than, for example, 100K Ohms. The effect of electronics aging and the overall impact to the determination of the insulation resistance will be discussed in more detail in connection with FIG. 3.

FIG. 3 depicts a table 90 corresponding to actual measurements of the insulation resistance and calculated values of the insulation resistance (i.e., Rp, Rn). The values corresponding to the actual (or real) measurement of $R_{ism}$ is generally in column 92. As illustrated, the values change based on the values of the resistance $R_p$ and $R_n$. The values corresponding to the calculated insulation resistance (i.e., calculated from the controller 54 of FIG. 2) is generally shown in column 94. It can be seen that each of the calculated insulation resistance values (see column 94) are within the acceptable range of 10M Ohms and 50M Ohms. However, the corresponding actual (or real) resistance values are less than 100K Ohms. Thus, these conditions exhibit that while the calculated insulation resistances appear to be sufficient, an insulation fault is actually present. Column 96 depicts the type of error that is present in connection with the electronics (e.g., the switches 56 and/or the resistors 58, 60). Column 98 depicts the permanent effect caused by the failure of the switches 56 and/or resistors 58, 60.

FIG. 4 depicts an apparatus 110 for diagnosing hardware faults (or errors) in the insulation resistance monitoring system 50 in accordance to one embodiment. The apparatus 110 is generally similar to the system 50 as illustrated in connection with FIG. 2. However, the apparatus 110 includes an additional switching arrangement 62d. The switching arrangement 62d indicates that all of the switches 62 are closed (or activated). The controller 54 is further modified in this embodiment to measure the corresponding value for $V_n$ where n is equal to 1, 2, 3 and 4 within a predetermined time frame. The measurement of the corresponding values for $V_n$ for each switching arrangement 62 is performed within the predetermined time frame after the corresponding switching arrangement 62 is executed to ensure that the measurement is performed during transient conditions. In one example, the predetermined time frame may correspond to, but not limited to, 100 ms after each switching arrangement 62 is executed. Once the values for $V_n$ have been recorded within the predetermined time frame and after the switching arrangements 62 have been executed, the controller 54 inserts the values for the calculated $V_n$, resistors 60 (e.g., $R_a$), and resistors 58 (e.g., $R_{b1}$, $R_{b2}$) in to inequality equations (e.g., inequality 1 and inequality 2) as set forth directly below:

$$\text{Inequality 1:} \quad \alpha \times V_{batt} < (V_1 - V_2) \times \frac{Ra + Rb1 + Rb2}{Ra}$$

$$\text{Inequality 2:} \quad \frac{V_1 + V_2}{2} = V_4 - (V_4 - V_3) \times \frac{Rb1/2}{Ra + Rb1 + Rb2} \pm th$$

In general, the inequality equations provide information corresponding to various issues related to the electronics (or hardware) (e.g., switches 56 and resistors 58, 60) which can provide inaccurate readings of the insulation resistance due to aging or degradation. For example, the variables of inequality 1 generally provide information regarding an overall voltage from both the positive and the negative branches (e.g., HV positive branch 14, HV negative branch 16, and LV positive branch 24, and LV negative branch 26). If there are not any hardware (or electronics) errors, then the overall voltage from both branches (e.g., HV and LV positive branches 14, 24, respectively, and HV and LV negative branches 16, 26, respectively) may be slightly larger or generally similar to the battery voltage (or $V_{batt}$) as shown in inequality 1. In the event a hardware (or electronics) error is present, then the overall voltage (e.g., on the right side of the equation of inequality 2) is smaller than the battery voltage. Variable a generally corresponds to any value between 0 and 1. Thus, the equation on the left side of inequality 1 may be set to $V_{batt}$ or to a value that is less than $V_{batt}$.

Now, in reference to inequality 2, the equation on the left side of inequality 2 is generally defined as a "mean voltage" and the equation on the right side of inequality 2 is generally defined as a "calculated voltage." The variables for inequality 2 generally provide information about a mean voltage from both the positive branch 14, 24 and the negative branch 16, 26. If there are not any hardware (or electronics) errors, then the mean voltage shall be generally equal to the measured voltage when both branches are activated at the same time. If an error occurs on the positive or on the negative branch (e.g., HV and LV positive branches 14, 24, respectively, and HV and LV negative branches 16, 26, respectively), then the mean voltage is larger (i.e. if on positive branch 14 or 24) or smaller (i.e., if on negative branch 16 or 26) than the calculated voltage. A term ± th in the equation for inequality 2 is used to select the range where the mean voltage is assumed to be equal to the calculated voltage.

Table 1 illustrates the manner in which the apparatus 110 determines whether a hardware error is present:

| Inequality 1 | Inequality 2 | Diagnostic |
| --- | --- | --- |
| Yes | Yes | Hardware or electronics (e.g., switches 56 and resistors 58, 60) is correct |
| Yes | No | Hardware error detected in either the positive branch (Ineq2: >0; e.g., in this case the mean voltage is larger than the calculated voltage) or the negative branch (Ineq2: <0; e.g., in this case the mean voltage is smaller than the calculated voltage) |
| No | No | Hardware error detected in either the positive branch (Ineq2: >0; e.g., in this case the mean voltage is larger than the calculated voltage) or the negative branch (Ineq2: <0; e.g., in this case the mean voltage is smaller than the calculated voltage) |
| No | Yes | Hardware error detected in both the positive branch and the negative branches |

As illustrated above in Table 1, in the event the condition of the equations for inequality 1 and 2 are met after the switching arrangements 62a-62d are executed (see Row 1 in Table 1), then the controller 54 determines that the hardware (i.e., the switches 56 and the resistors 58, 60) is correct, or determines that the insulation resistance monitoring as performed by the apparatus 110 is correct as the hardware has not undergone degradation or aging that would otherwise impact the integrity of the measurement of the insulation resistance monitoring.

In the event the equation for inequality 1 is correct and the equation for inequality 2 is incorrect (see Row 2 in Table 1), then the controller 54 determines the presence of a hardware failure or error in either the positive branch (e.g., HV positive branch 14 or the LV positive branch 24) or the negative branch (e.g., HV negative branch 16 or the LV negative branch 26). The same failure mode is present in the event each of the equations for inequality 1 and inequality 2 is incorrect (see Row 3 in Table 1). In the event the equation for inequality 1 is incorrect and the equation for inequality 2 is correct, then the controller 54 determines that a hardware failure on both the positive and negative branches (see Row 4 in Table 1). The controller 54 is configured to assess the integrity of the hardware or electronics (e.g., switches 56 and resistors 58 and 60) once the vehicle 11 is detected to be in a park condition once in a driving cycle or once the vehicle 11 is in standby. If the controller 54 determines that a hardware error is present (e.g., see conditions noted in rows 2-4 of Table 1), then the controller 54 may transmit an error warning to the system 50.

Figure 5A:
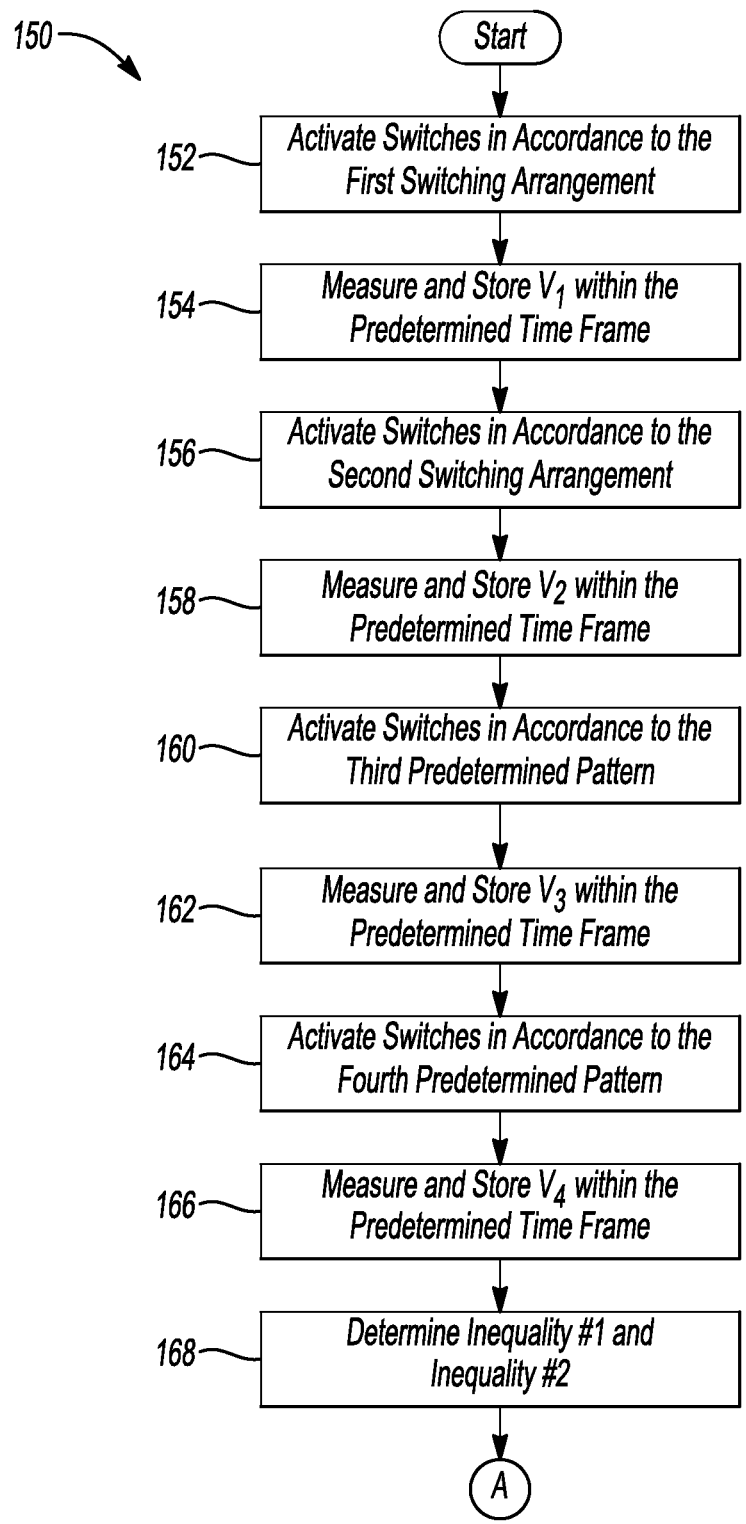
FIGS. 5A-5B depict a method for diagnosing hardware in an insulation resistance monitoring system in accordance to one embodiment.
Figure 5B:
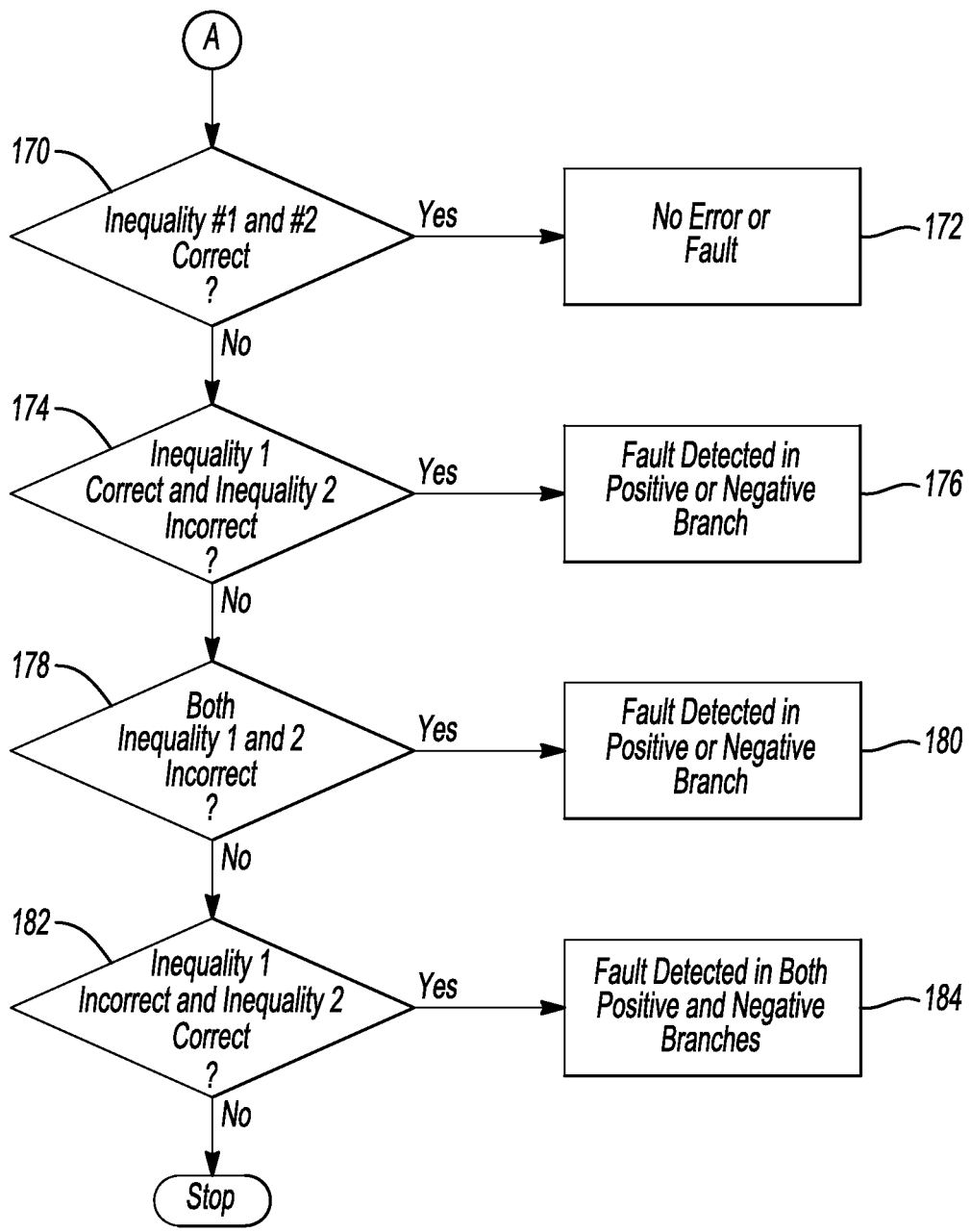

FIGS. 5a-5b depict a method 150 for assessing the integrity of electronics used in the insulation resistance monitoring system 50 in accordance to one embodiment. While not shown, it is recognized that the method 150 may be executed upon every occurrence of the vehicle 11 being detected to be in a park mode (e.g., vehicle is not moving and a transmission of the vehicle 11 is detected be in a park) once in a driving cycle or once the vehicle 11 is in standby. Further, the method 150 is executed independently of the insulation resistance monitoring system 50.

In operation 152, the controller 54 activates the switches 56 in accordance to the first switching arrangement 62a (e.g., the controller 54 closes the switches 56a and 56c and opens the switch 56b).

In operation 154, the controller 54 measures and stores the value for $V_1$ within the predetermined time frame (or during a transient period).

In operation 156, the controller 54 activates the switches 56 in accordance to the second switching arrangement 62b (e.g., the controller 54 deactivates the switch 56a and activates the switches 56b and 56c).

In operation 158, the controller 54 measures and stores the value for $V_2$ within the predetermined time frame (or during a transient period).

In operation 160, the controller 54 activates the switches 56 in accordance to the third switching arrangement 62c (e.g., the controller 54 opens the switches 56a and 56b and closes the switch 56c).

In operation 162, the controller 54 measures and stores the value for $V_3$ within the predetermined time frame (or during a transient period).

In operation 164, the controller 54 activates the switches 56 in accordance to a fourth switching arrangement (e.g., the controller 54 closes the switches 56a-56c).

In operation 166, the controller 54 measures and stores the value for $V_4$ within the predetermined time frame (or during a transient period).

In operation 168, the controller 54 inserts the measured values for $V_1$, $V_2$, and $V_3$ into equations inequality 1 and 2. Additionally, the controller 54 inserts the values for the resistors 58 and 60 and $V_{batt}^{(Vn)}$ into equations inequality 1 and 2 and solves the same.

In operation 170, the controller 54 determines whether the conditions for the equations of inequality 1 and 2 are correct. If this condition is true, then the method 150 moves to operation 172. If not, then the method 150 moves to operation 174.

In operation 172, the controller 54 determines or assesses that the integrity of the hardware is correct and that consequently there is no issue in performing the insulation resistance monitoring.

In operation 174, the controller 54 determines whether the condition for inequality 1 is correct and whether the condition for inequality 2 is incorrect. If this condition is true, then the method 150 moves to operation 176. If not, then the method 150 moves to operation 178.

In operation 176, the controller 54 determines that there is a hardware fault or error with the electronics in either the positive branch 14 and/or 24 or the negative branch 16 and/or 26 and provides a warning to the user. As noted above, in the event inequality 2 is less than 0 (e.g., in this case the mean voltage is smaller than the calculated voltage), then the controller 54 determines that there is an error in the negative branch 16 and/or 26. In the event inequality 2 is greater than 0 (e.g., in this case the mean voltage is greater than the calculated voltage), then the controller 54 determines that there is an error in the positive branch 14 and/or 24.

In operation 178, the controller 54 determines whether the condition for inequality 1 is incorrect and whether the condition for inequality 2 is incorrect. If this condition is true, then the method 150 moves to operation 180. If not, then the method 150 moves to operation 182.

In operation 180, the controller 54 determines that there is a hardware fault or error with the electronics in either the positive branch 14 and/or 24 or the negative branch 16 and/or 26 and may provide a warning to the system 50. As noted above, in the event inequality 2 is less than 0 (e.g., in this case the mean voltage is smaller than the calculated voltage), then the controller 54 determines that there is an error in the negative branch 16 and/or 26. In the event inequality 2 is greater than 0 (e.g., in this case the mean voltage is greater than the calculated voltage), then the controller 54 determines that there is an error in the positive branch 14 and/or 24.

In operation 182, the controller 54 determines whether the condition for the equation of inequality 1 is incorrect and whether the condition for the equation of inequality 2 is correct. If this condition is true, then the method 150 moves to operation 184. If not, then the method 150 stops and is re-executed again, when the vehicle 11 is detected to be, for example, in a next park mode (e.g., or once the vehicle 11 is in standby).

In operation 184, the controller 54 determines that there is a hardware fault or error with the electronics in the positive branch 14 and/or 24 and the negative branch 16 and 26 and may provide a warning to the system 50.

Figure 6:
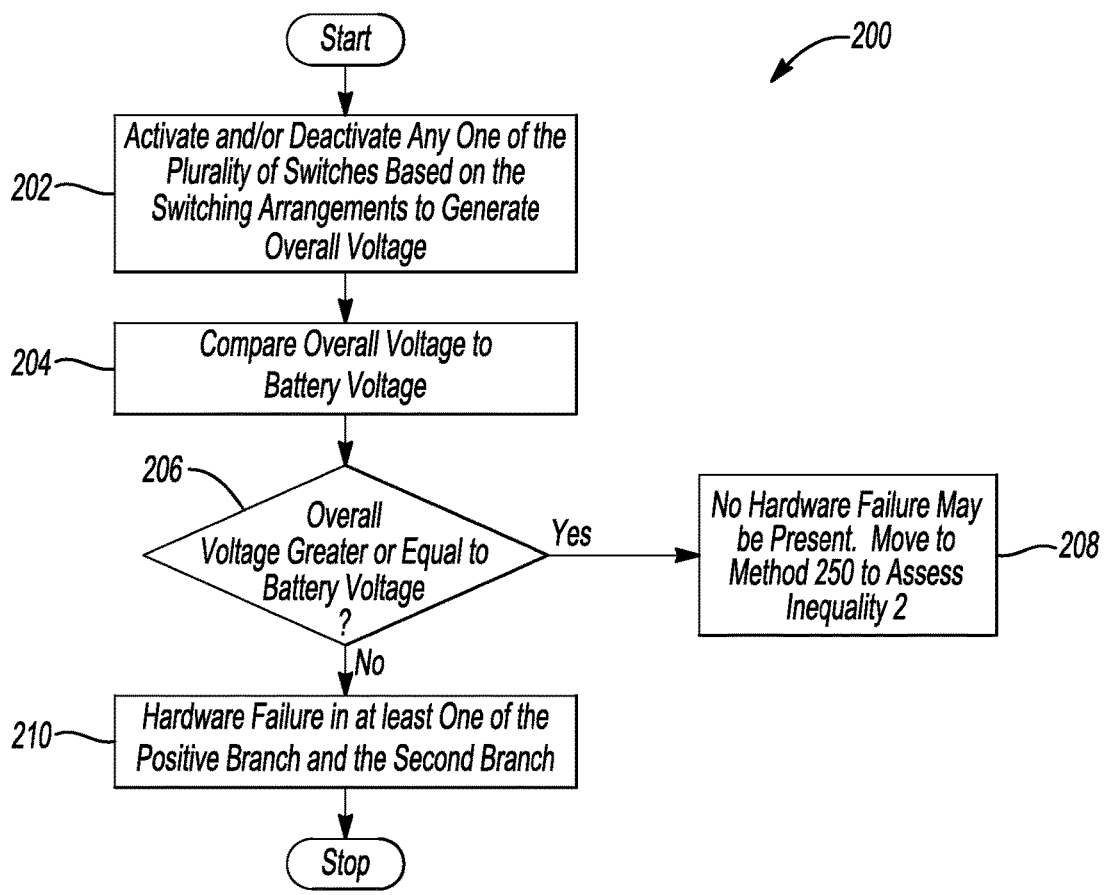
FIG. 6 depicts a method for diagnosing hardware in the insulation resistance monitoring system based on conditions of inequality 1 in accordance to one embodiment.

FIG. 6 depicts a method 200 for diagnosing hardware in the insulation resistance monitoring system 50 based on the noted conditions of inequality 1 in accordance to one embodiment. The method 200 is provided to illustrate that operations noted above to ascertain the values for inequality 1 can be used to detect faults with the electronics in the insulation resistance monitoring system 50.

In operation 202, the controller 54 activates and/or deactivates the switches 56 in accordance to the various switching arrangements 62 as noted above and obtains the overall voltage of the positive branch 14, 24 and the negative branch 16, 26 (e.g., see right side of the equation in inequality 1).

In operation 204, the controller 54 compares the overall voltage to a battery voltage. For example, the battery voltage (e.g., see left side of the equation in inequality 1) is compared to the overall voltage (e.g., see right side of the equation in inequality 1).

In operation 206, if the controller 54 determines that the overall voltage is greater than, or equal to the battery voltage, then the method 200 moves to operation 208. If not, then the method 200 moves to operation 210.

In operation 208, the controller 54 may determine that a hardware failure (or fault) is not present as long as the conditions of inequality 2 are correct (e.g., see row 1 of Table 1). The controller 54 may determine that there is a hardware failure if the conditions of inequality 2 are not correct (e.g., see row 2 of Table 1) even if the overall voltage is greater than, or equal to the battery voltage. In general, the controller 54 is configured to assess the conditions of inequality 2 prior to making a determination that a hardware failure is not present.

In operation 210, the controller 54 determines that the there is a hardware failure in at least one of the positive branch 14, 24 and the negative branch 16, 26. If it is necessary to ascertain where the fault is located (e.g., in the positive branch 14, 24 and/or in the negative branch 16, 26), then the controller 54 will assess the conditions of inequality 2 to provide additional information relative to which branch 14, 24 or 16, 26 the fault is located.

Figure 7:
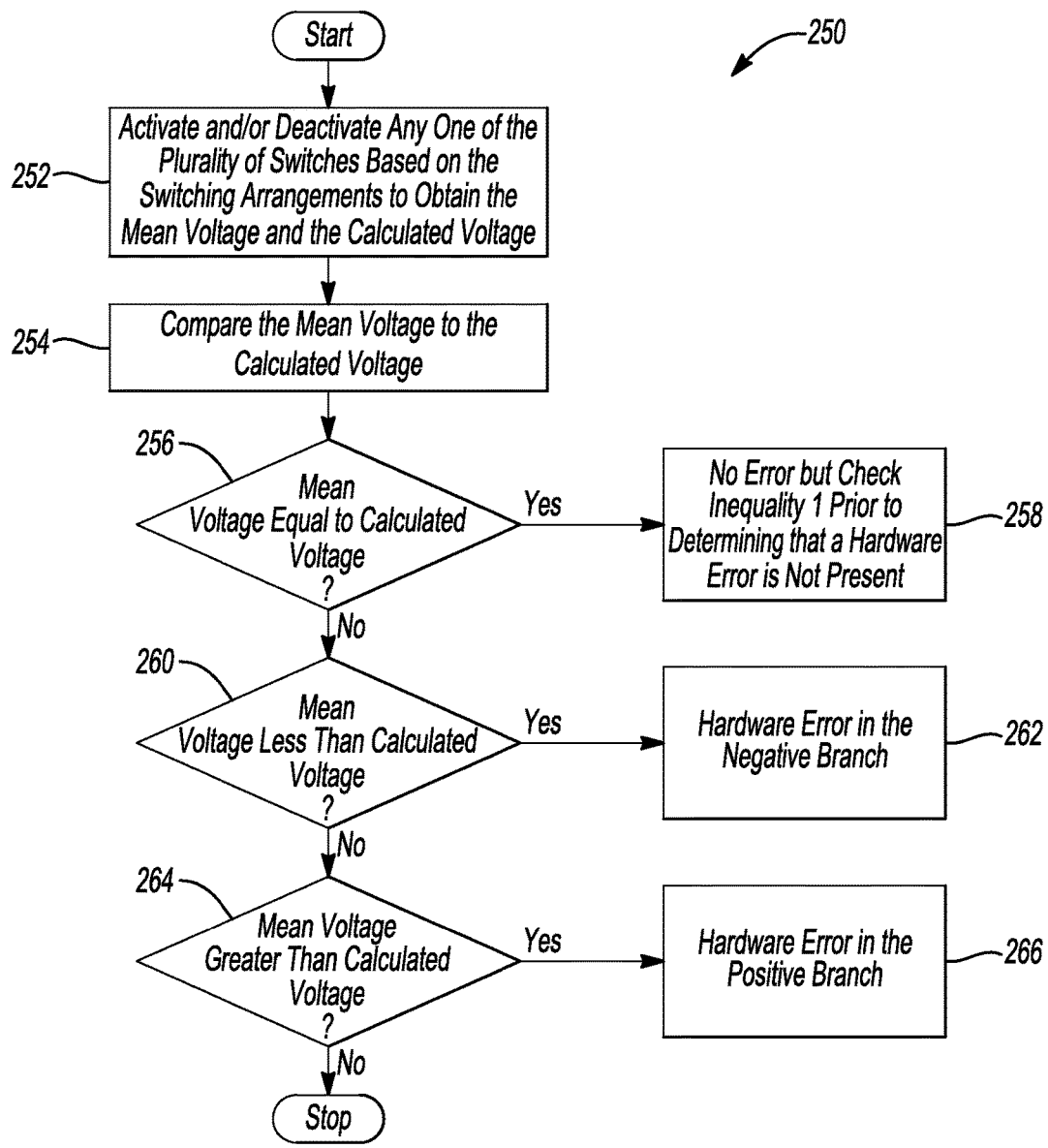
FIG. 7 depicts a method for diagnosing hardware in the insulation resistance monitoring system based on conditions of inequality 2 in accordance to one embodiment.

FIG. 7 depicts a method 250 for diagnosing hardware in the insulation resistance monitoring system via the measure voltage and the calculated voltage in accordance to one embodiment.

In operation 252, the controller 54 activates and/or deactivates the switches 56 in accordance to the various switching arrangements 62 as noted above to obtain the mean voltage and the calculated voltage.

In operation 254, the controller 54 compares the mean voltage to the calculated voltage. For example, the mean voltage (e.g. see left side of the equation in inequality 2) is compared to the calculated voltage (e.g., see right side of the equation in inequality 2).

In operation 256, if the controller 54 determines that the mean voltage is equal to the calculated voltage, then the method 250 moves to operation 258. If not, then the method 250 moves to operation 260.

In operation 258, the controller 54 may determine that a hardware failure (or fault) is not present as long as the conditions of inequality 1 are correct (e.g., see row 1 of Table 1). However, the controller 54 may determine that there is a hardware failure if the conditions of inequality 1 are not correct (e.g., see row 4 of Table 1) even if the mean voltage is equal to the calculated voltage. In general, the controller 54 is configured to assess the conditions of inequality 1 prior to making a determination that a hardware failure is not present.

In operation 260, the controller 54 determines whether the mean voltage is less than the calculated voltage. If this condition is true, then the method 250 moves to operation 262. If not, then the method 250 moves to operation 264.

In operation 262, the controller 54 determines that there is a hardware failure in the negative branch 16, 26. See rows 2 and 3 of Table 1 as this condition illustrates that irrespective of the outcome for the conditions of inequality 1, a hardware failure is present in the negative branch 16, 26.

In operation 264, the controller 54 determines whether the mean voltage is greater than the calculated voltage. If this condition is true, then the method 250 moves to operation to operation 266.

In operation 266, the controller 54 determines that there is a hardware failure in the positive branch 14, 24. See rows 2 and 3 of Table 1 as this condition illustrates that irrespective of the outcome for the conditions of inequality 1, a hardware failure is present in the positive branch.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An apparatus for diagnosing electronics in an insulation resistance monitoring system, the apparatus comprising:
   a controller for being electrically coupled to a plurality of electronics including a plurality of switches that are electrically coupled to a positive branch and to a negative branch in a high voltage network and a low voltage network, the plurality of electronics being configured to perform insulation resistance monitoring in a vehicle, the controller being configured to:
   at least one of activate and deactivate any number of the plurality of switches to determine an overall voltage of the positive branch and the negative branch;
   detect a fault in at least one of the positive branch and the negative branch that corresponds to a failure of any one of the plurality of electronics based on the overall voltage, and
   determine the overall voltage independently of the insulation resistance monitoring being performed in the vehicle.

2. The apparatus of claim 1 wherein the controller is further configured to compare the overall voltage to a battery voltage to detect the fault in the at least one of the positive branch and the negative branch.

3. The apparatus of claim 2 wherein the controller is further configured to detect the fault in the at least one of the positive branch and the negative branch in response to determining that the overall voltage is less than the battery voltage.

4. The apparatus of claim 1 wherein the controller is further configured to at least one of activate and deactivate any number of the plurality of switches to determine a mean voltage of the at least one positive branch and the negative branch.

5. The apparatus of claim 4 wherein the controller is further configured to detect the fault in the at least one of the positive branch and the negative branch that corresponds to the failure of the any one of the plurality of electronics based on the mean voltage.

6. The apparatus of claim 5 wherein the controller is further configured to compare the mean voltage to a calculated voltage to detect the fault in the at least one of the positive branch and the negative branch.

7. The apparatus of claim 6 wherein the controller is further configured to detect the fault in the at least one of the positive branch and the negative branch in response to determining one of (i) the mean voltage being less than the calculated voltage, and (ii) the mean voltage being greater than the calculated voltage.

8. The apparatus of claim 4 wherein the controller is further configured to determine the mean voltage independently of the insulation resistance monitoring being performed in the vehicle.

9. An apparatus for diagnosing electronics in an insulation resistance monitoring system, the apparatus comprising:
a controller for being electrically coupled to a plurality of electronics including a plurality of switches that are electrically coupled to a positive branch and a negative branch in a high voltage network and a low voltage network, the plurality of electronics being configured to perform insulation resistance monitoring in a vehicle, the controller being configured to:
at least one of activate and deactivate any number of the plurality of switches to determine a mean voltage of the positive branch and the negative branch;
detect a fault in at least one of the positive branch and the negative branch that corresponds to a failure of any one of the plurality of electronics based on the mean voltage; and
determine the mean voltage independently of the insulation resistance monitoring being performed in the vehicle.

10. The apparatus of claim 9 wherein the controller is further configured to compare the mean voltage to a calculated voltage to detect the fault in the at least one of the positive branch and the negative branch.

11. The apparatus of claim 10 wherein the controller is further configured to detect the fault in the at least one of the positive branch and the negative branch in response to determining one of (i) the mean voltage being less than the calculated voltage, and (ii) the mean voltage being greater than the calculated voltage.

12. The apparatus of claim 9 wherein the controller is further configured to at least one of activate and deactivate any number of the plurality of switches to determine an overall voltage of the positive branch and the negative branch.

13. The apparatus of claim 12 wherein the controller is further configured to detect a fault in at least one of the positive branch and the negative branch that corresponds to a failure of any one of the plurality of electronics based on the overall voltage.

14. The apparatus of claim 13 wherein the controller is further configured to compare the overall voltage to a battery voltage to detect the fault in the at least one of the positive branch and the negative branch.

15. The apparatus of claim 14 wherein the controller is further configured to detect the fault in the at least one of the positive branch and the negative branch in response to determining that the overall voltage is less than the battery voltage.

16. The apparatus of claim 12 wherein the controller is further configured to determine the overall voltage independently of the insulation resistance monitoring being performed in the vehicle.

17. An apparatus for diagnosing electronics in an insulation resistance monitoring system, the apparatus comprising:
a controller for being electrically coupled to a plurality of electronics including a plurality of switches that are electrically coupled to a positive branch and a negative branch in a high voltage network and a low voltage network, the plurality of electronics being configured to perform insulation resistance monitoring in a vehicle, the controller being configured to:
at least one of activate and deactivate any number of the plurality of switches to determine an overall voltage and a mean voltage of the positive branch and the negative branch;
detect a fault in at least one of the positive branch and the negative branch that corresponds to a failure of any one of the plurality of electronics based on the overall voltage, and
determine the overall voltage and the mean voltage independently of the insulation resistance monitoring being performed in the vehicle.

* * * * *